US005528821A

United States Patent [19]

Matsuzawa

[11] Patent Number: 5,528,821

[45] Date of Patent: Jun. 25, 1996

[54] CONNECTOR EXAMINING DEVICE INCLUDING ENGAGEMENT MEMBER INSERTING TOOL

[75] Inventor: Susumu Matsuzawa, Iwate-gun, Japan

[73] Assignee: Sumitomo Wiring Systems, Ltd., Mie, Japan

[21] Appl. No.: 381,325

[22] Filed: Jan. 31, 1995

Related U.S. Application Data

[62] Division of Ser. No. 115,002, Sep. 1, 1993, Pat. No. 5,438, 748.

[30] Foreign Application Priority Data

Sep. 3, 1992 [JP] Japan ................................ 4-62159 U

[51] Int. Cl.$^6$ ........................... H01R 43/26; G01R 31/04

[52] U.S. Cl. ................................ 29/705; 29/267; 29/750; 324/538

[58] Field of Search ............................. 29/267, 705, 747, 29/752, 758, 33 M; 324/537, 538; 340/635, 687

[56] References Cited

U.S. PATENT DOCUMENTS

| | | | |
|---|---|---|---|
| 3,885,287 | 5/1975 | Long et al. | 29/705 |
| 3,949,467 | 4/1976 | Mayala et al. | 29/752 X |
| 4,085,497 | 4/1978 | Nijman et al. | 29/267 X |
| 4,387,501 | 6/1983 | Rix | 29/752 X |
| 4,394,795 | 7/1983 | Goss | 29/758 X |
| 4,467,516 | 8/1984 | John et al. | 29/752 X |
| 4,862,580 | 9/1989 | Wang et al. | 29/758 X |
| 4,867,712 | 9/1989 | Kato et al. | 439/752 |
| 4,902,968 | 2/1990 | Sugimoto | 324/538 X |
| 5,199,161 | 4/1993 | Stachura | 29/705 |
| 5,327,641 | 7/1994 | Olsson | 29/750 |

FOREIGN PATENT DOCUMENTS

| | | | |
|---|---|---|---|
| 2-5383 | 1/1990 | Japan | 29/705 |
| 4-23391 | 4/1992 | Japan . | |

*Primary Examiner*—Peter Vo

*Attorney, Agent, or Firm*—Beveridge, DeGrandi, Weilacher & Young

[57] ABSTRACT

A tool for inserting an engagement member for a connector is designed so that the engagement member is inserted into a housing to engage a terminal in the housing. The tool has a tool body provided with a path in which the housing slides. Facing the path, a pusher is provided to push the engagement member into the housing. When the connector is pushed in the path in the tool, the connector slides therein, and, the pusher comes in contact with the engagement member. In this way, the engagement member is pushed into the housing. The operator does not directly push the engagement member with his or her hands and fingers, and alternatively he or she may push the housing in the path. Thus, the burden of the operation of inserting the engagement member is greatly lightened.

16 Claims, 7 Drawing Sheets

CONNECTOR EXAMINING DEVICE INCLUDING ENGAGEMENT MEMBER INSERTING TOOL

This application is a divisional of application Ser. No. 08/115,002 filed on Sep. 1, 1993, now U.S. Pat. No. 5,438, 748 which application is entirely incorporated herein by reference.

BACKGROUND OF THE INVENTION

1. Field of the Invention

The present invention relates to a tool used to insert an engagement member which may be applied to a connector designed so that the engagement member is pushed into its housing to engage a terminal with the housing.

The present invention also relates to a connector examining device for checking the condition of the terminal of the connector or the like. The connector herein is used for interconnecting wire harnesses or connection between various electrical equipments in an automobile or the like.

2. Description of the Related Art

For wiring of electrical equipment in an automobile, a connector is used to interconnect wire harnesses or connect a wire harness with an electrical equipment. The connector generally has a housing made of synthetic resin and male or female terminals accommodated in terminal containers formed in the housing. The terminals are engaged with the housing in the so-called housing lance system. When housings of the male and female connectors are fitted, the male and female terminals interconnect with each other, and are regulated and combined to attain an electrical connection.

The housing lance system is a technology according to which an elastic engagement arm integral with the housing protrudes toward an inner space of each terminal container and is engaged with an aperture or abutment of an electric contact of each terminal so as to prevent the terminal from slipping off. In the course of inserting the terminal into the housing, the engagement arm comes in contact with the terminal and is elastically transformed. When the terminal is perfectly inserted, the engagement arm restores its original shape and is engaged with the aperture or abutment of the terminal. Thus, inserting the terminal into the housing completely, the terminal is automatically engaged with the housing.

However, the engagement arm cannot be formed so large, and repetitive attachment/detachment of the male and female connectors to or from each other may cause the engagement arm to be damaged, so that eventually the terminal may drop out of the housing.

In recent years, a connector employing a double engagement arrangement has been used. In such a connector, an engagement member to engage with a terminal is fitted in a housing from its side after the terminal is inserted in the housing so as to attain an extra engagement of the terminal in addition to the engagement in the housing lance system. Such a connector is disclosed in Japanese Examined Patent Publication No. 23391/1992.

The connector disclosed in the official gazette has its housing provided with a through-hole at a side, and an engagement member is inserted in the through-hole. The engagement member, before a terminal is inserted in the housing, is retracted under a temporary engagement in position so that the terminal can be inserted. After the terminal is inserted, the engagement member is pushed into the housing to attain the double engagement.

In the above arrangement, the engagement member is temporarily engaged with the housing in advance, and therefore, the housing and the engagement member can be regarded as substantially a single component. Hence, inventory management and the like can be advantageously simplified.

The connector having the double engagement arrangement as mentioned above requires an operation of inserting the terminal into housing and an operation of pushing the engagement member into the housing. Since the engagement member is relatively small, manual insertion of the engagement member into the housing is more difficult work than that judged by appearances.

Especially, at the production line of wire harnesses, one operator may do both the operations of inserting the terminal and pushing the engagement member to more than one thousand connectors a day. It is an excessive burden upon the operator manually doing those operations on numerous connectors, and this leads to degradation of productivity.

Hence, lightening the burden of the operation of inserting the engagement member has been desired.

SUMMARY OF THE INVENTION

It is an object of the present invention to overcome a technological problem as mentioned above and to provide a tool for inserting an engagement member for a connector, which can greatly lighten the operation of inserting the engagement member.

It is another object of the present invention to provide a connector examining device having a structure for lightening an operation of inserting an engagement member.

The tool of the present invention has a tool body provided with a path along which a housing of a connector can slide, and a pusher for pushing an engagement member in the housing in the course of sliding the housing in the path. The pusher is positioned facing to the path of the tool body, and it comes in contact with the engagement member which is temporarily engaged with the housing, when the housing slides in the path.

In the above-mentioned arrangement, the engagement member is pushed into the housing not by direct manipulation with fingers but by sliding the housing in the path of the tool. Thus, the burden of the operator is lightened, compared with a case where the operator manually pushes the engagement member into the housing. As a result, productivity of an article using a connector such as a wire harness is greatly enhanced.

Additionally, the connector examining device of the present invention has its pusher provided facing to the receiving space of a connector receiving portion which holds the connector to be checked. The pusher comes in contact with the engagement member temporarily engaged with the housing and pushes the engagement member into the housing when the housing of the connector is attached to the connector receiving portion.

In the above-mentioned arrangement, the engagement member is pushed into the housing when the connector is attached to the connector receiving portion for checking the connector. Thus, the engagement member is pushed into the housing not by direct manipulation with fingers but by an operation of attaching the housing to the connector receiving portion. This greatly lightens the burden of the operator.

These and other objects, features and advantages of the present invention will become more fully apparent from the following detailed description of the preferred embodiments if taken in conjunction with the accompanying drawings.

DESCRIPTION OF PREFERRED EMBODIMENTS

Figure 1:
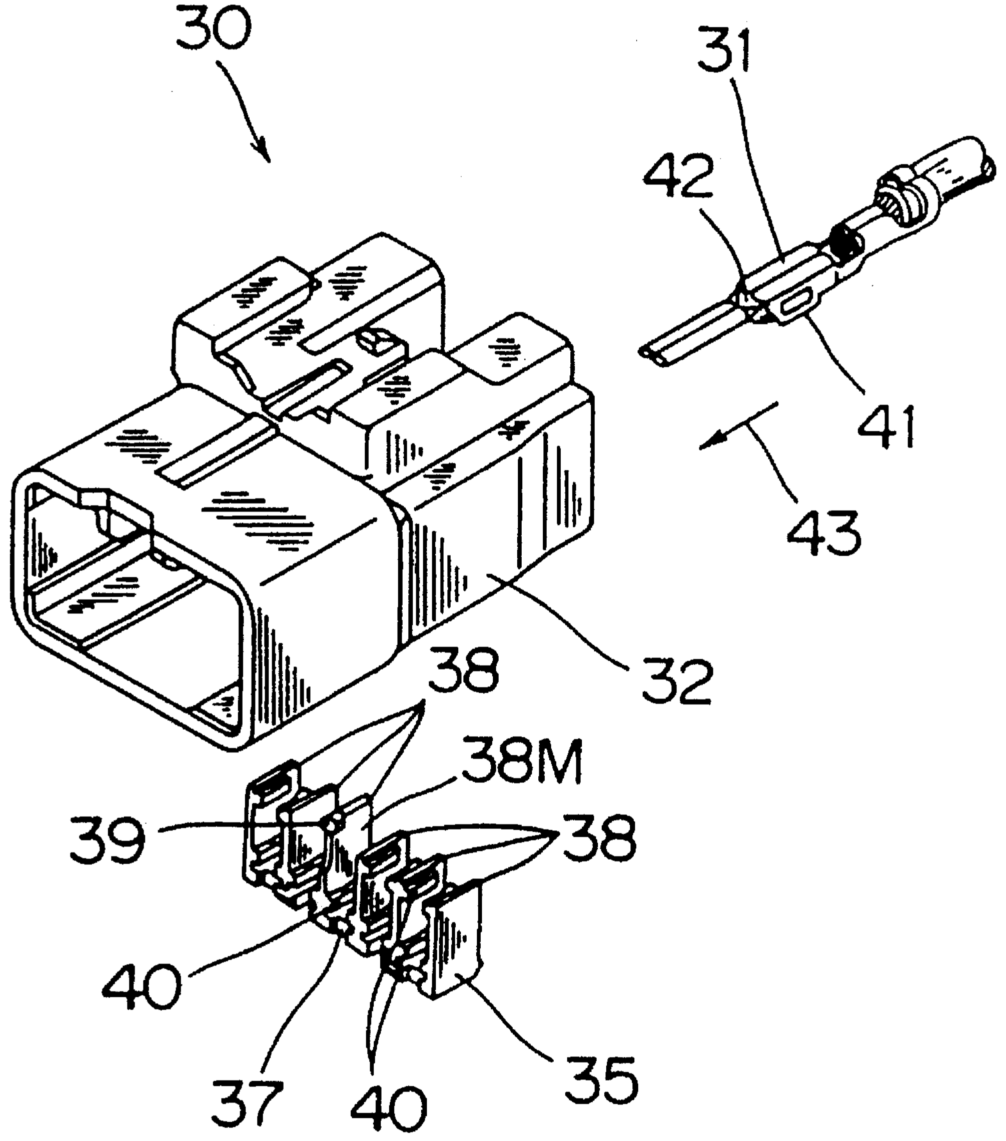
FIG. 1 is an exploded perspective view showing a structure of a connector to which a preferred embodiment of the present invention is applied.
Figure 2:
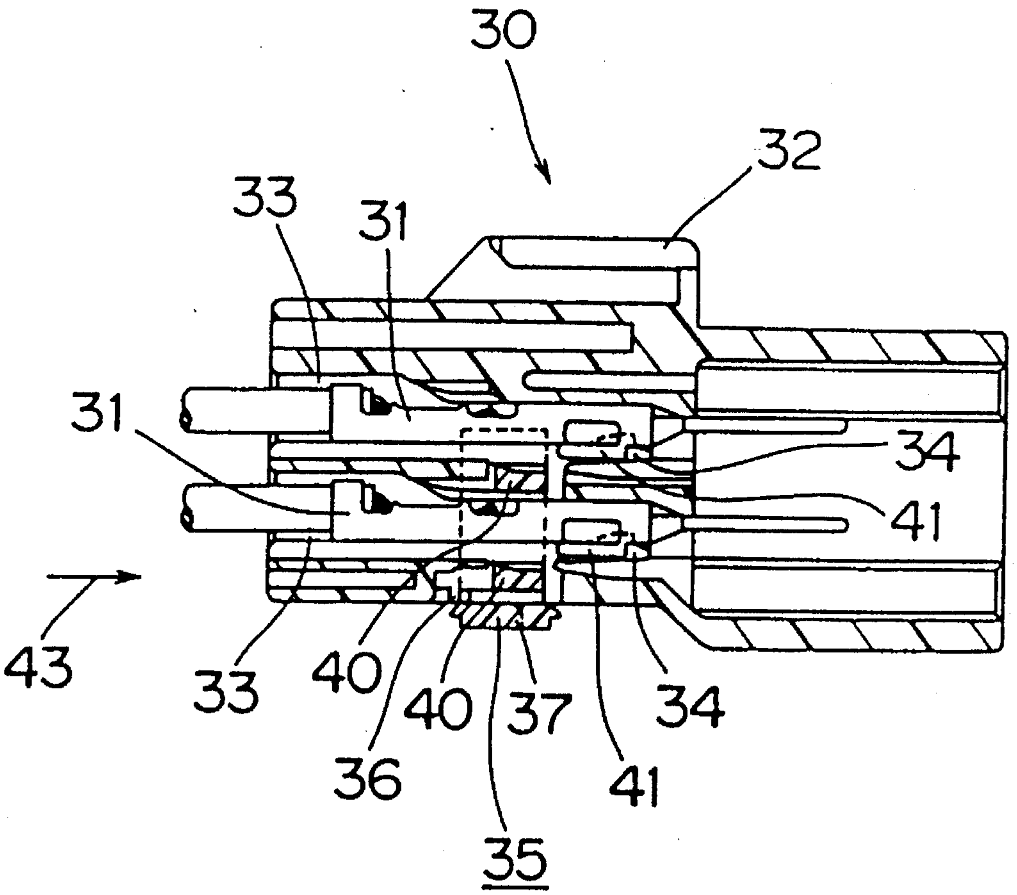
FIG. 2 is a sectional view of the connector.

FIG. 1 is an exploded perspective view showing an exemplary configuration of a connector to which a tool for inserting an engagement member for a connector according to an embodiment of the present invention is applied, FIG. 2 is a cross sectional view showing the connector assembled. FIGS. 1 and 2 show a configuration of a male connector 30 having male terminals 31 fitted in its male housing 32.

The male housing 32 is formed of resin molded products, having several terminal containers 33 therein. An elastic engagement arm 34 integral with the housing 32 protrudes into each of the terminal containers 33. When the terminal 31 is inserted in the housing 32 in a direction of arrow 43, the terminal 31 comes in contact with the engagement arm 34 in the course of insertion to elastically transform the engagement arm 34. When the terminal 31 is inserted up to its terminal insertion position, the engagement arm 34 restores into its original shape and is engaged with an aperture 42 of the terminal 31. Thus, engagement of the terminal 31 with the housing 32 in the so-called housing lance system is attained.

After the terminal 31 is inserted in the housing 32, a retainer 35 acting as an engagement member is inserted therein. A through-hole 36 formed at a side of the housing 32 leads to the inner space of the connector housing 32, and the comb-shaped retainer 35 is fitted in the through-hole 36. The retainer 35 has a plurality of locking pieces 38 protruding from a junction 37. A center locking piece 38M has a temporary engagement portion 39 at its distal end and an engagement portion 40 at its proximate portion. The remaining locking pieces 38 have their respective engagement portions 40 at their distal and proximate portions, respectively.

Before the terminal 31 is inserted in the housing 32, the retainer 35 is temporarily engaged with the housing in a temporary engagement position as shown in FIG. 2. In this situation, the engagement portions 40 are retracted in position so as to permit insertion of the terminal 31. When the retainer 35 is set in the temporary engagement position, the temporary engagement portion 39 formed at the distal end of the center locking piece 38M is engaged with the housing 32 to prevent the retainer 35 from slipping off.

After terminals 31 to be attached to the housing 32 are all inserted therein, the retainer 35 is pushed into the housing 32. In this situation, each of the engagement portions 40 formed in each of the locking pieces 38 is engaged with a raised portion 41 of each terminal 31 in each terminal container 33. This is an extra engagement of the terminal 31 in addition to the engagement in the housing lance system as mentioned above, and thus, a double engagement of the terminal 31 is attained.

When the retainer 35 is perfectly pushed into the housing 32, a surface of the junction 37 of the retainer 35 is in the same plane of the housing 32 or lies inside from the surface of the housing 32.

Figure 3:
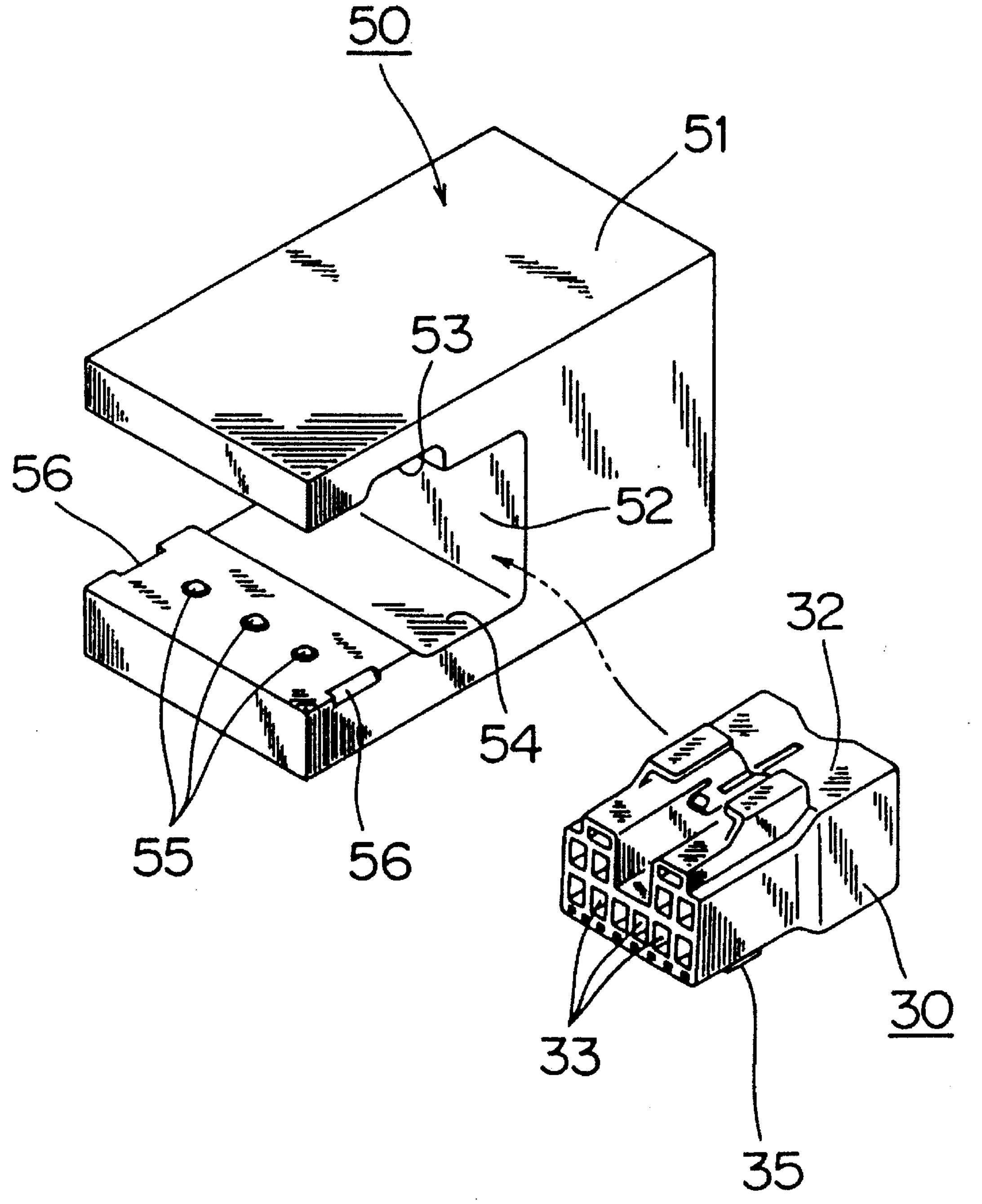
FIG. 3 is a perspective view illustrating a configuration of a tool for inserting an engagement member for the connector according to the embodiment of the present invention.

FIG. 3 is a perspective view showing a configuration of a tool 50 for inserting an engagement member which is used to push the retainer 35 of the connector 30 configured as in the above into the housing 32. The tool 50 is used to push the retainer 35 temporarily engaged with the housing 32 of the connector 30 into the housing 32 in a process of fabricating a wire harness.

The tool 50 has a tool body 51 which has an almost U-shaped cross section. A path 52 is formed in the tool body 51 so as to slide the connector 30 along the elongated extension of the retainer 35. Grooves 53, 54 suitable to a shape of the housing 32 are formed in the path 52. Thus, the path 52 is formed so as to pass the connector 30 therethrough.

Three ball plungers 55 acting as a pusher are fixed to the tool body 51, facing to the path 52. The ball plungers 55 are aligned in position so that they come in contact with the retainer 35 when the connector 30 is passing in the path 52.

At an entrance of the path 52 is provided with a tapered portion 56 in a position where the retainer 35 passes.

Figure 4:
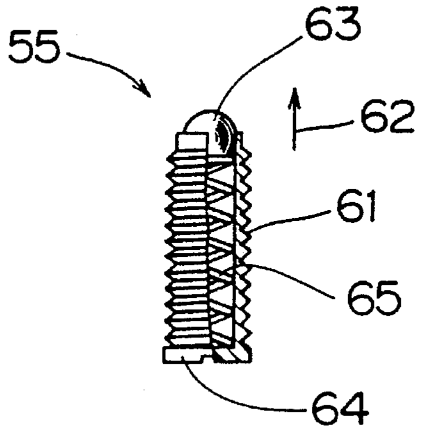
FIG. 4 is a partially cut-away elevational view illustrating a configuration of a ball plunger.

FIG. 4 is a partially cut-away elevational view showing a configuration of one of the ball plungers 55. The ball plunger 55 has a cylindrical holder 61 threaded in its outer surface, a coil spring 65 accommodated in the cylindrical holder 61, a ball 63 which is elastically urged by the coil spring 65 in a direction of arrow 62 to protrude/retract from or into the cylindrical holder 61. The ball 63 comes in contact with the retainer 35. At the bottom of the cylindrical holder 61, a bolt 64 is fixed.

When the ball plunger 55 is mounted on the tool body 51, a threaded hole is first formed in the tool body 51, and then, the cylindrical holder 61 is screwed into the hole. A screwdriver is used to turn the bolt 64 so that the cylindrical holder 61 is screwed.

Figure 5:
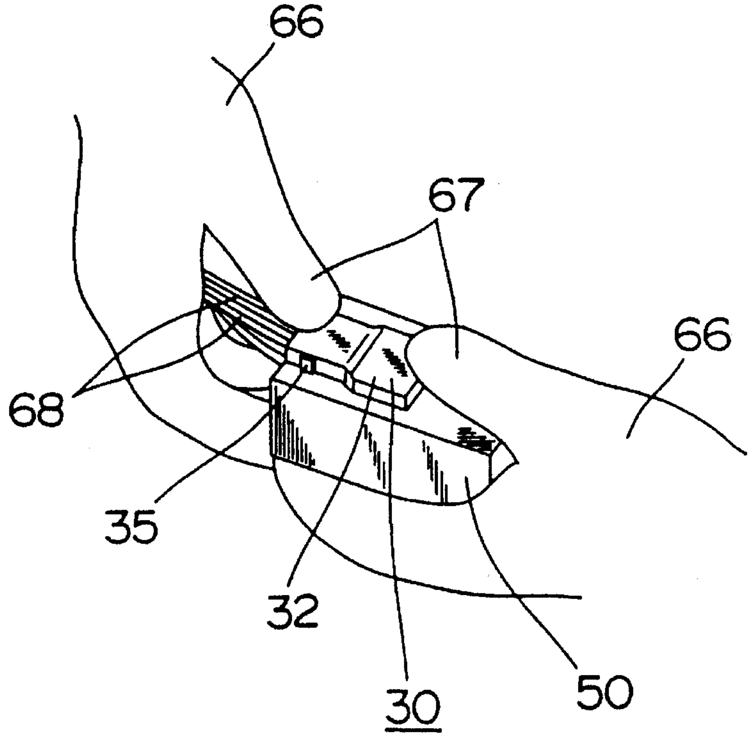
FIG. 5 is a perspective view showing the tool of the embodiment in use.

FIG. 5 is a simplified perspective view showing the tool 50 in use. The operator holds the tool 50 in his or her hands 66 and then pushes the connector 30 in the path 52 by his or her fingers 67. Reference numeral 68 denotes electric wires.

As has been described, while the connector 30 passes in the path 52, the ball 63 of each ball plunger 55 protruding from the path 52 presses the retainer 35. Thus, the retainer 35 is pushed into the housing 32.

As previously mentioned, according to the present invention, pushing the connector 30 into the tool 50, the retainer 35 can be easily pushed into the housing 32. The retainer 35 is small, and if the operator pushes the retainer 35 into the housing 32 with his or her hands and fingers, his or her hands and fingers are fatigued with overuse. Meanwhile, in this embodiment, pushing the housing 32 into the path 52 is enough; since the objects to manipulate are large, the operator does not feel as if his or her hands and fingers are so fatigued. Thus, if the operator does retainer inserting work on a lot of connectors, he or she will not be charged with excessive burden and will do wire harness fabricating work efficiently.

In the tool 50 of this embodiment, the ball plungers 55 protrude in the path 52. Hence, the ball plungers 55 enter the housing 32 deeper into the inside from its surface if the surface of the retainer 35 is retracted into the housing 32 from its surface under the complete attachment of the retainer 35. In this way, the retainer 35 can be perfectly attached.

Figure 6:
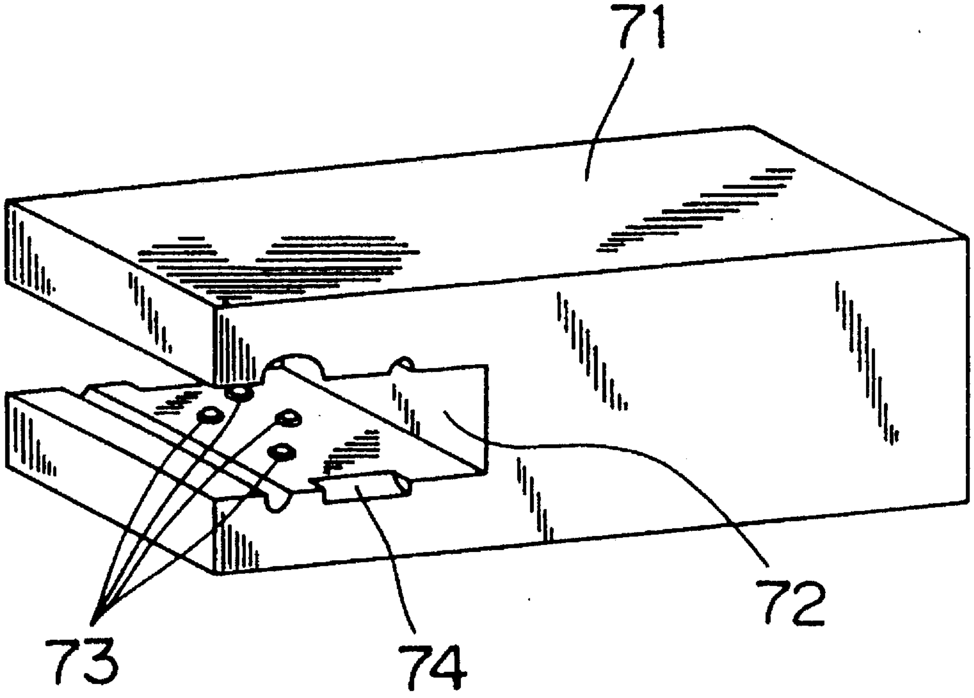
FIG. 6 is a perspective view illustrating a modification of the tool of the embodiment.

The number and arrangement of the ball plungers 55, and the form of the path 52 may be appropriately varied depending upon a shape and type of the connector. As shown in FIG. 6, when the retainer is wide, for example, a plurality of ball plungers 73 may be arranged in parallel lines, facing a path 72 formed in a tool body 71. Reference numeral 74 denotes a tapered portion which guides the retainer.

Figure 7:
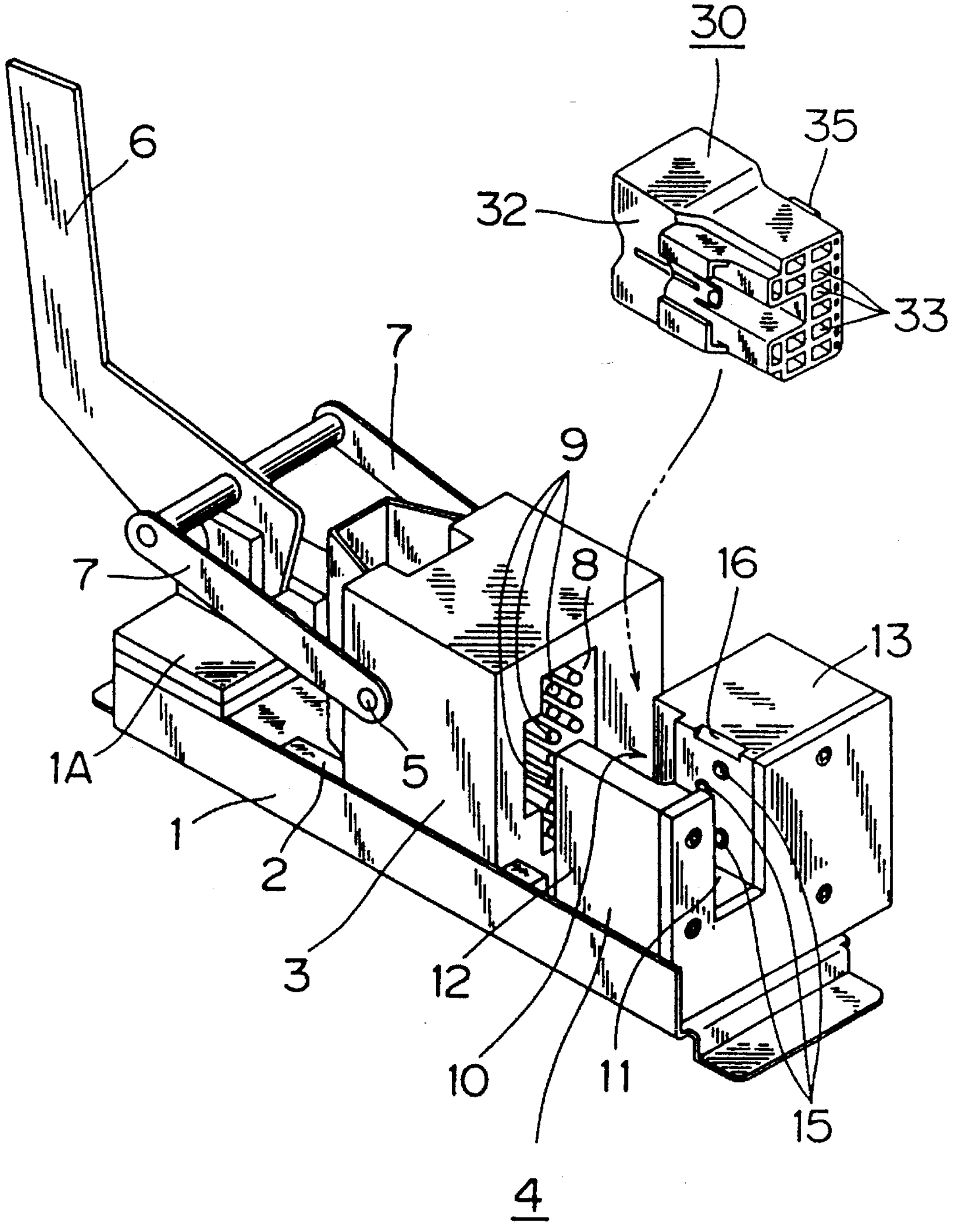
FIG. 7 is a perspective view showing a basic structure of a connector examining device of an embodiment according to the present invention.

FIG. 7 is a perspective view of a structure of another embodiment of the present invention, showing a configuration of a connector examining device. The connector examining device is used to check connectors attached to a wire harness. The wire harness to be checked is mounted on a drawing board for examination on which a connection pattern of electric wires is drawn in advance. A connector examining device as shown in FIG. 7 is fixed in each position on the drawing board where the connector of the wire harness is placed.

On a base 1 fixed to the drawing board, a connector receiving portion 4 capable of holding the connector 30 to be checked is fixed. The base 1 is provided with slide rails 2 on which a detector portion 3 is slidably fitted. A lever mounting portion 1A is attached to one end of the detector portion 3. A lever 6 is pivotaly fixed to the lever mounting portion 1A to pivot about an axial line in parallel with the base 1 and orthogonal with the slide rails 2. One end of each of links 7 is fixed in a position eccentric from the axial line of the rotation of the lever 6 while the other end of each link 7 is fitted on a projection 5 protruding from a side of the detector portion 3.

A recess 8 is formed in the opposite side of the detector portion 3 apart from the lever 6. Within the recess 8, a plurality of detectors 9 are arranged in parallel, protruding toward the connector receiving portion 4. The detectors 9 are arranged so that their heads are positioned opposed to the terminals of the connector 30 held by the connector receiving portion 4. The detectors 9 are elastically urged toward the connector receiving portion 4 by a coil spring not shown in the drawing.

The connector receiving portion 4 has an almost U-shaped cross section orthogonal to the slide rails 2 and includes a receiving space 10 for holding the connector 30 to be checked. A notch 11 through which electric wires (not shown) drawn from the connector 30 extend is formed at a trailing end of the connector receiving portion 4.

The connector receiving portion 4 has a pair of side walls 12 and 13 along the slide rails 2, and the side wall 13 has a plurality of ball plungers 15 disposed in its inner surface facing the receiving space 10. The ball plungers 15 are arranged in position so that the retainer 35 faces them when the connector 30 is set in the receiving space 10 of the connector receiving portion 4. Each of the ball plungers 15 has the same configuration as the ball plunger 55 shown in FIG. 4; that is, it includes a ball which protrudes/retracts at its distal end, and the ball is elastically urged toward the receiving space 10.

The connector 30 to be checked is attached to the connector receiving portion 4 with the retainer 35 being oriented-toward the side wall 13 having the ball plungers 15, as shown in FIG. 7. A tapered portion 16 is formed in a position opposed to the retainer 35 of the connector 30 in an upper part of the side wall 13. Hence, even if the retainer 35 protrudes from a surface of the housing 32, the tapered portion 16 is helpful to guide the protruding retainer 35, and insertion of the housing 32 into the connector receiving portion 4 can be easily facilitated.

In the course of inserting the housing 32 into the connector receiving portion 4, the retainer 35 comes in contact with the ball plungers 15 and receives force toward the center of the housing 32 from the ball plungers 15. In this way, the retainer 35 is pushed into the housing 32.

When the connector 30 is attached to the connector receiving portion 4, the operator pulls the lever 6 up. As he or she pulls up the lever 6, the detector portion 3 is displaced toward the connector receiving portion 4, and the connector 30 slips into the recess 8. Then, the detectors 9 come in contact with tips of the terminals 31 of the connector 30. As the lever 6 is further pulled up against the force of the coil spring (not shown) which urges the detectors 9, the detectors 9 are drawn in the detector portion 3, and ultimately end surfaces of the detector portion 3 and the connector receiving portion 4 come in contact with each other.

In this situation, the force of the coil spring applied to the detectors 9 produces contact pressure between the detectors 9 and the terminals 31, and electric conduction is obtained between them. In this way, it is checked if the terminals 31 are well attached, if the terminals 31 are well crimped to electric wires, and so forth.

In this embodiment as previously mentioned, the retainer 35 is pushed into the housing 32 in the course of attaching the connector 30 to be checked to the connector receiving portion 4. Thus, the operator does not directly press the retainer 35 with his or her hands and fingers, but the housing 32 is pushed into the connector receiving portion 4 to insert the retainer 35 in the housing 32, and therefore, the burden on the operator is lightened. Since the conduction check of the connectors is an essential process in fabricating a wire harness, although a preparatory operation of inserting the retainer into housing may be omitted, alternatively the retainer 35 may be inserted simultaneous with the conduction check of the connector 30. This enables simplification of the process of fabricating a wire harness, and hence, productivity can be further enhanced.

Although the preferred embodiments of the present invention have been described, the present invention should not be limited to those embodiments. In the embodiment shown in FIG. 7, for example, a link mechanism is utilized to slide the detector portion on the base, but a cam mechanism shown in FIG. 8 may take the place of it.

Figure 8:
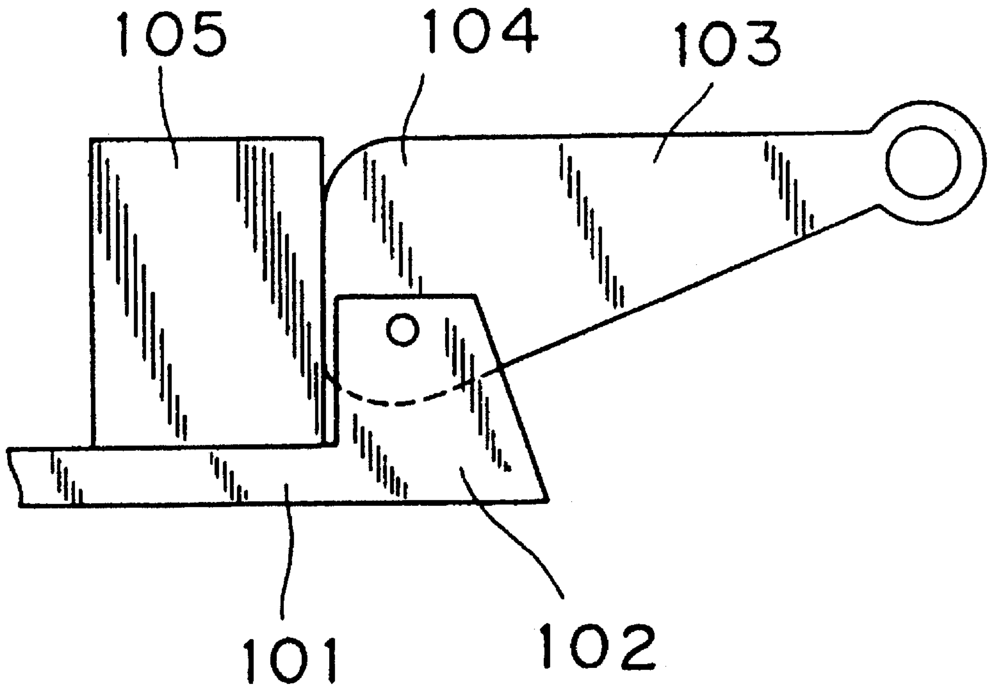
FIG. 8 is an elevational view showing an arrangement in which a cam mechanism is utilized to slide a detector portion.

In the arrangement shown in FIG. 8, a lever mounting portion 102 erects at one end of a base 101, and a lever 103 is pivotaly fixed to the lever mounting portion 102. A cam 104 is formed integral with the lever 103, and the cam 104 comes in contact with a rear end surface of a detector portion 105. With such an arrangement, pulling up or down the lever 103 allows the detector portion 105 to slide on the base 101.

Although the detector portion is displaced in the embodiment shown in FIG. 7, the detector portion and the connector receiving portion may be relatively displaced close/apart to or from each other. Thus, a varied arrangement where the connector receiving portion is displaced may be employed, or another varied arrangement where both the detector portion and the connector receiving portion are displaced may be employed.

In addition to that, although a case where the male connector with the male terminals 31 is to be checked has been described in conjunction with the embodiment shown in FIG. 7, a female connector with a female terminal, if configured similarly, may also undergo the conduction check, insertion of the retainer, etc.

The disclosure of Japanese Utility Model Application Serial No. 62159/1992, filed on Sep. 3, 1992, is incorporated herein by reference.

While the preferred embodiments of the present invention have been described in detail, these are only examples set forth to clarify the technological subjects of the present invention, and the present invention should not be narrowly taken by way of limitation to them. The true spirit and scope of the present invention should be defined by the description of the appended claims.

What is claimed is:

1. A connector examining device used to check a connector and push an engagement member temporarily engaged with a housing of the connector into the housing to engage the engagement member with a terminal within the housing, said connector examining device comprising:

a connector receiving portion having a receiving space for accommodating and holding the connector to be checked to which the terminal is attached in advance and with which the engagement member is temporarily engaged in advance, a detector portion positioned opposed to said connector receiving portion and having a detector which corresponds to the terminal of the connector to be checked and protrudes toward said connector receiving portion, means for holding said connector receiving portion and said detector portion so that they can be relatively displaced close to or apart from each other along an extension of said detector, and a pusher, positioned in the receiving space of said connector receiving portion, said pusher facing said receiving space for coming into contact with the engagement member temporarily engaged with said housing when said housing is placed in said connector receiving portion, and for pushing the engagement member into said housing.

2. A connector examining device according to claim 1, wherein said connector examining device checks if the terminal is well attached based upon whether electric conduction is obtained between the terminal of the connector and said detector when said connector receiving portion and said detector portion are placed close to each other.

3. A connector examining device according to claim 1, wherein said pusher protrudes to or retracts from the receiving space, and said connector examining device further includes means for elastically urging said pusher toward said engagement member.

4. A connector examining device according to claim 1, wherein said connector receiving portion is provided with a sloped area at an entrance of said receiving space to guide said engagement member into the receiving space.

5. A connector examining device, comprising:

a connector receiving portion having a receiving space defined therein for accommodating and holding a connector to be examined, wherein the connector to be examined includes a terminal within a housing of the connector, and an engagement member is temporarily engaged with the housing;

a detector portion positioned opposed to the connector receiving portion and having a detector which corresponds to the terminal of the connector to be examined;

means for holding the connector receiving portion and the detector portion so that they can be relatively displaced close to or apart from each other; and a pusher positioned in the receiving space of the connector receiving portion, said pusher facing said receiving space, wherein the pusher is provided for coming into contact with the engagement member temporarily engaged with the housing when the housing is placed in the connector receiving portion and for pushing the engagement member into the housing, wherein the pusher includes a means for elastically urging a portion of the pusher toward the receiving space.

6. A connector examining device according to claim 5, wherein the connector receiving portion is provided with a tapered portion to guide the engagement member into the receiving space.

7. A connector examining device according to claim 5, wherein a plurality of pushers protrude into the receiving space.

8. A connector examining device according to claim 7, wherein each of the pushers is a ball plunger.

9. A connector examining device according to claim 5, wherein the pusher is a ball plunger.

10. A connector examining device according to claim 9, wherein the ball plunger includes:

a holder;

a spring extending within the holder, wherein the spring acts as the means for elastically urging; and a ball located at one end of the spring and positioned such that a portion of the ball extends outside of the holder and into the receiving space such that the ball acts as the portion of the pusher which is urged by the means for elastically urging.

11. A connector examining device according to claim 10, wherein the holder is cylindrical.

12. A connector examining device according to claim 5, wherein the receiving space of the connector receiving portion is U-shaped.

13. A connector examining device according to claim 5, wherein the receiving space of the connector receiving portion is U-shaped and includes grooves formed therein corresponding to an exterior shape of the housing of the connector to be examined.

14. A connector examining device according to claim 5, wherein the receiving space is defined by three walls, wherein the pusher protrudes from one of the three walls.

15. A connector examining device according to claim 5, wherein the means for holding includes two links connected to the detector portion and a lever connected to the two links.

16. A connector examining device according to claim 5, wherein the means for holding includes a cam device which is used to move the detector portion.

* * * * *